(12) United States Patent
Tanaka et al.

(10) Patent No.: US 11,462,634 B2
(45) Date of Patent: Oct. 4, 2022

(54) SEMICONDUCTOR DEVICE AND MANUFACTURING METHOD THEREOF

(71) Applicant: Mitsubishi Electric Corporation, Tokyo (JP)

(72) Inventors: Koji Tanaka, Tokyo (JP); Ryuji Ueno, Tokyo (JP); Masahiro Ujike, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 161 days.

(21) Appl. No.: 16/990,089

(22) Filed: Aug. 11, 2020

(65) Prior Publication Data

US 2021/0143269 A1   May 13, 2021

(30) Foreign Application Priority Data

Nov. 7, 2019 (JP) .............................. JP2019-202087

(51) Int. Cl.
*H01L 29/739* (2006.01)
*H01L 29/08* (2006.01)
*H01L 29/66* (2006.01)

(52) U.S. Cl.
CPC ...... *H01L 29/7397* (2013.01); *H01L 29/0834* (2013.01); *H01L 29/66348* (2013.01)

(58) Field of Classification Search
CPC ............. H01L 29/7397; H01L 29/0834; H01L 29/456; H01L 29/66136; H01L 2924/12031; H01L 29/868; H01L 29/872–8725; H01L 29/66143; H01L 29/66212; H01L 29/66325–66348; H01L 29/7393–7398; H01L 29/083–0834

See application file for complete search history.

(56) References Cited

U.S. PATENT DOCUMENTS

| | | | |
|---|---|---|---|
| 2007/0004098 A1* | 1/2007 | Kazama | H01L 29/7393 257/E29.198 |
| 2016/0351561 A1* | 12/2016 | Senoo | H01L 29/4238 |
| 2017/0207331 A1 | 7/2017 | Nakanishi et al. | |
| 2018/0261700 A1* | 9/2018 | Tanaka | H01L 29/8611 |

FOREIGN PATENT DOCUMENTS

| | | |
|---|---|---|
| JP | 2002-151438 A | 5/2002 |
| JP | 2017-130478 A | 7/2017 |
| WO | WO-2017119066 A1 * 7/2017 | ......... H01L 27/0814 |

* cited by examiner

*Primary Examiner* — Shahed Ahmed

(74) *Attorney, Agent, or Firm* — Studebaker & Brackett PC

(57) ABSTRACT

An object of the present invention is to provide a semiconductor device capable of reducing the on-voltage and a manufacturing method thereof. According to the present invention, a semiconductor device includes a Si substrate, a p-type anode layer provided on the front surface of the Si substrate, an anode electrode provided on the p-type anode layer, an n-type cathode layer and a p-type cathode layer provided adjacent to each other on a back surface of the Si substrate, an Al alloy layer provided on the n-type cathode layer and containing Si, and an Al alloy layer provided on the p-type cathode layer and containing Si, in which impurity concentration in the n-type cathode layer is 1E19 cm$^{-3}$ or higher and impurity concentration in the p-type cathode layer is 10% or lower of the impurity concentration in the n-type cathode layer.

14 Claims, 9 Drawing Sheets

F I G. 1
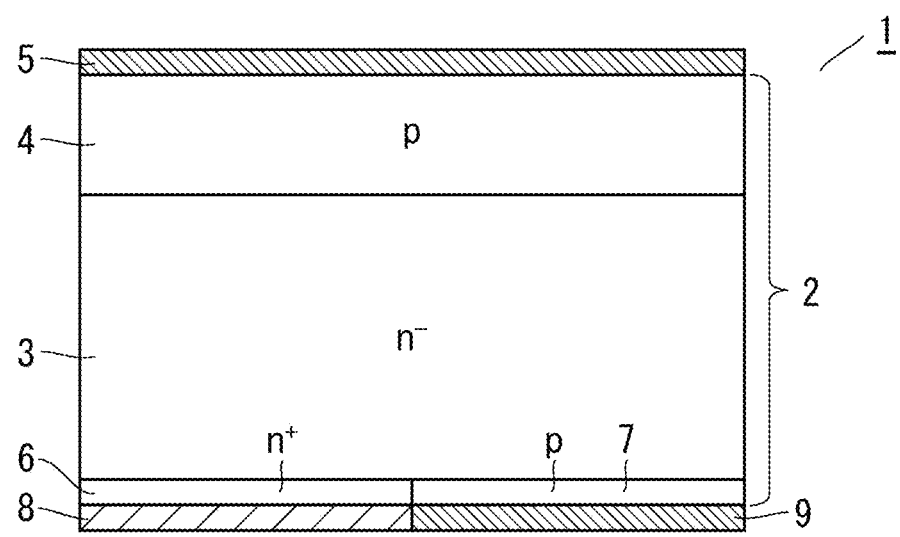

FIG. 2
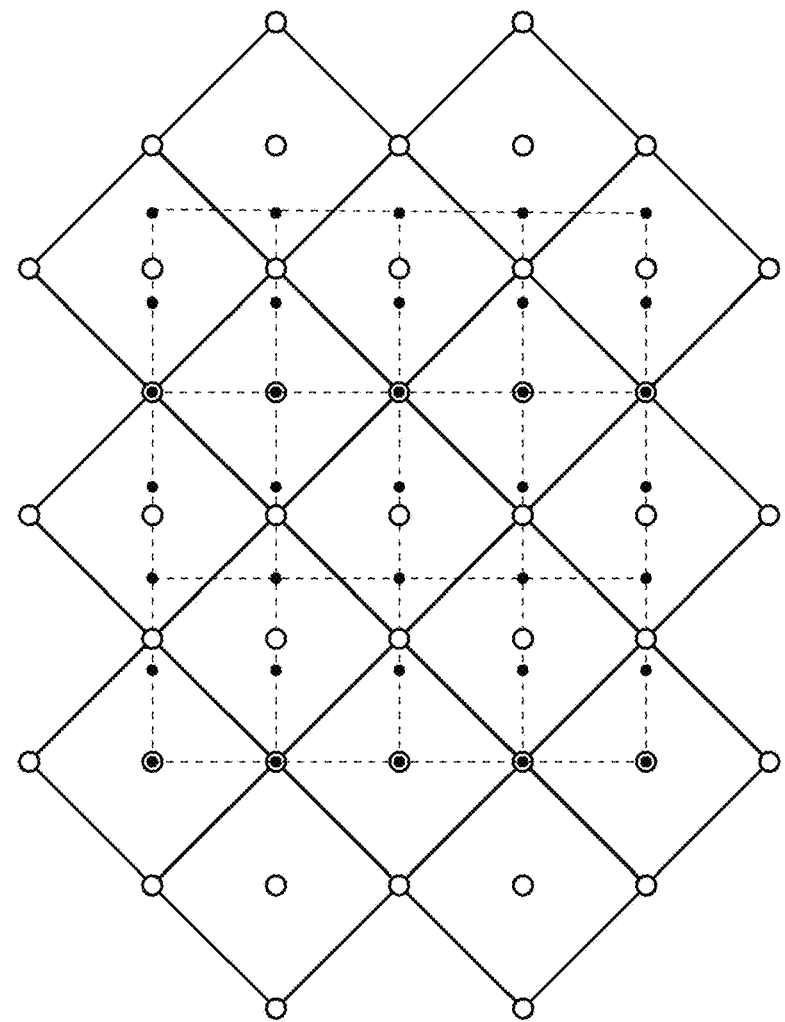
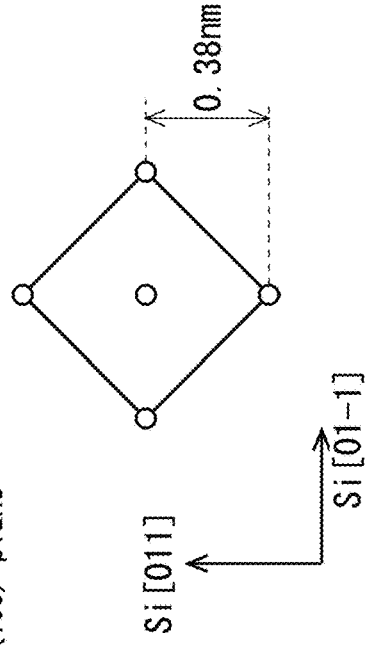
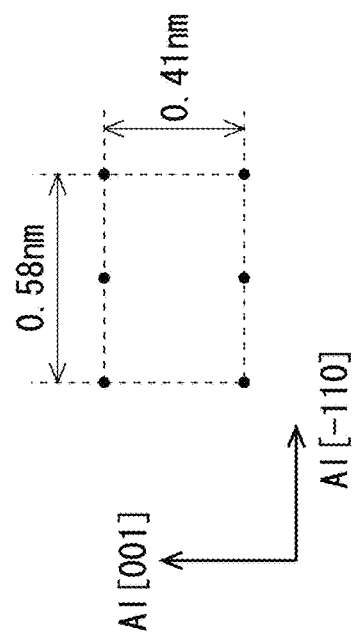

FIG. 3
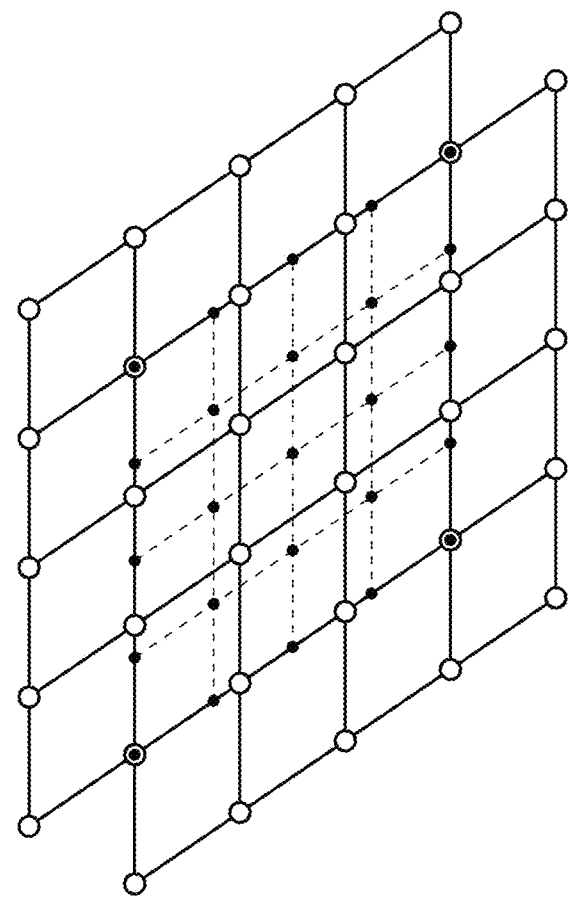
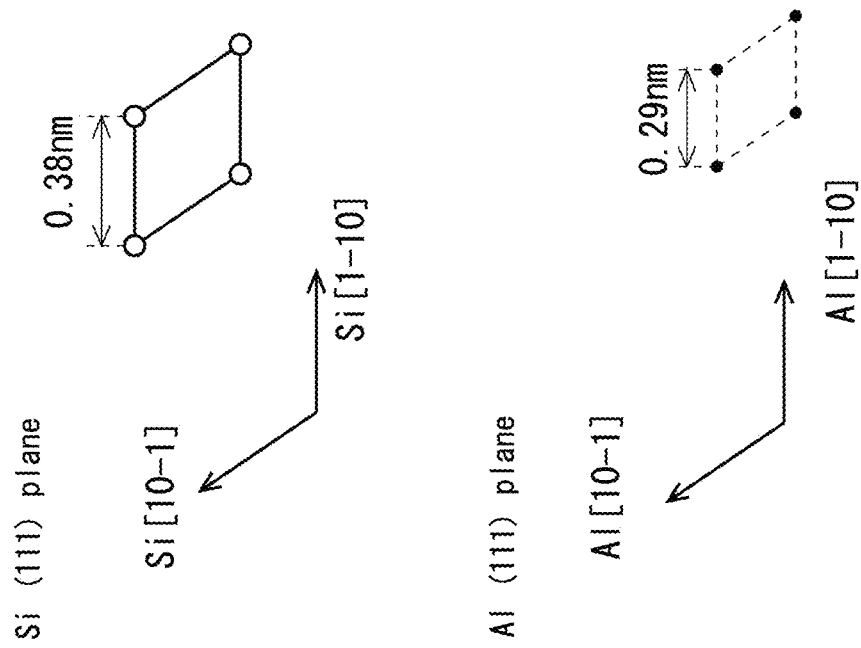

F I G. 6
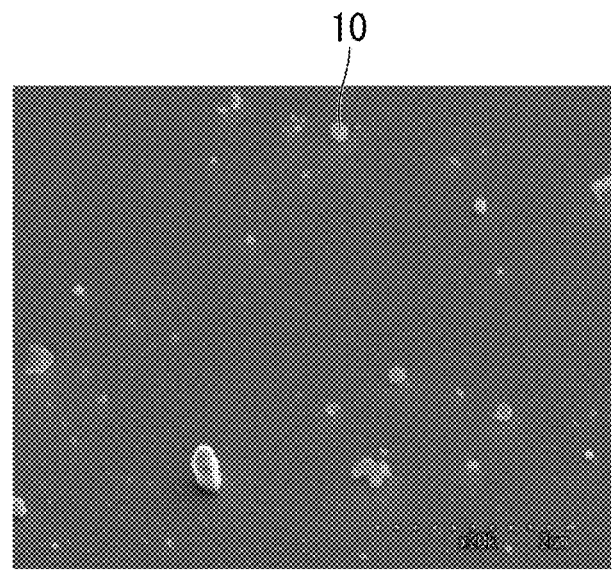
F I G. 7
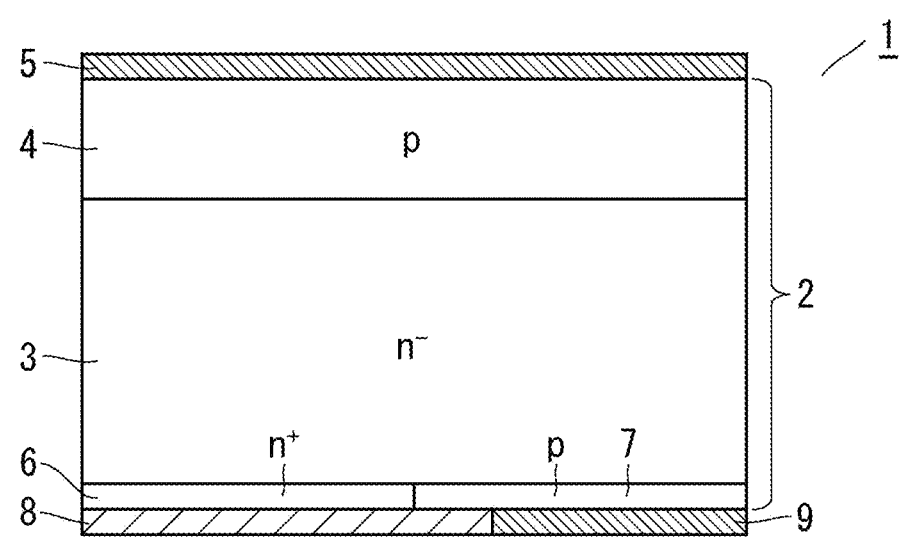

SEMICONDUCTOR DEVICE AND MANUFACTURING METHOD THEREOF

BACKGROUND OF THE INVENTION

Field of the Invention

The present invention relates to a semiconductor device represented by a diode or a Reverse Conducting-Insulated Gate Bipolar Transistor (RC-IGBT) having a pattern of an n-type cathode layer and a p-type cathode layer on the back surface thereof, and a manufacturing method of the same.

Description of the Background Art

Conventionally, a structure having a pattern of an n-type cathode layer and a p-type cathode layer on the back surface has been adopted in order to suppress a voltage jump at the time of recovery of a diode. For the back electrode of the diode or RC-IGBT having such a structure, an aluminum (Al) alloy in which silicon (Si) is contained in Al is used from the viewpoint of ohmic contact and adhesion (for example, Japanese Patent Application Laid-Open No. 2017-130478). The Al alloy layer formed of an Al alloy has the property in which the orientation of the crystal orientation is the (111) plane. This is because Al has a face-centered-cubic structure in which the (111) plane is the most closely packed (for example, Japanese Patent Laid-Open No. 2002-151438). Hereinafter, the diode or RC-IGBT is generically referred to as "semiconductor device".

SUMMARY

In the conventional structure that has a pattern of an n-type cathode layer and a p-type cathode layer on the back surface and uses an Al alloy for the back electrode, Si is contained in the back electrode; therefore, Si nodules are formed that impart p-type properties on the n-type cathode layer. The formation of the Si nodules has been a problem of an increase in on-voltage. The Al alloy layer is oriented in the (111) plane on the entire surface, and the Si nodules are formed on each of the n-type cathode layer and the p-type cathode layer on the back surface, and only the n layer affects the on-voltage.

An object of the present invention is to provide a semiconductor device capable of reducing the on-voltage and a manufacturing method thereof.

According to the present invention, a semiconductor device includes an n-type semiconductor substrate, a p-type anode layer provided on a front surface of the n-type semiconductor substrate, an anode electrode provided on the p-type anode layer, an n-type cathode layer and a p-type cathode layer provided adjacent to each other on a back surface of the n-type semiconductor substrate, a first Al alloy layer provided on the n-type cathode layer and containing Si, and a second Al alloy layer provided on the p-type cathode layer and containing Si, in which impurity concentration in the n-type cathode layer is $1E19 \text{ cm}^{-3}$ or higher and impurity concentration in the p-type cathode layer is 10% or lower of the impurity concentration in the n-type cathode layer.

According to the present invention, the semiconductor device includes a first Al alloy layer provided on the n-type cathode layer and containing Si, and a second Al alloy layer provided on the p-type cathode layer and containing Si, in which the impurity concentration in the n-type cathode layer is $1E19 \text{ cm}^{-3}$ or higher, and the impurity concentration in the p-type cathode layer is 10% or lower of the impurity concentration in the n-type cathode layer; therefore, reduction in the on-voltage is ensured.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a diagram for illustrating crystal orientations of Si and Al according to Embodiment 1 of the present invention;

FIG. 3 is a diagram for illustrating crystal orientations of Si and Al according to Embodiment 1 of the present invention;

FIG. 6 is a diagram illustrating a state of a surface of an n-type cathode layer after the formation of the Al alloy layer according to Embodiment 1 of the present invention;

FIG. 7 is a cross-sectional view illustrating a configuration of the semiconductor device according to Embodiment 1 of the present invention;

FIG. 12 is a cross-sectional view illustrating a configuration of a semiconductor device according to a related technique;

FIG. 13 is a diagram illustrating a state of a back surface of a Si substrate after the formation of an Al alloy layer according to the related technique;

DESCRIPTION OF THE PREFERRED EMBODIMENTS

Figure 4:
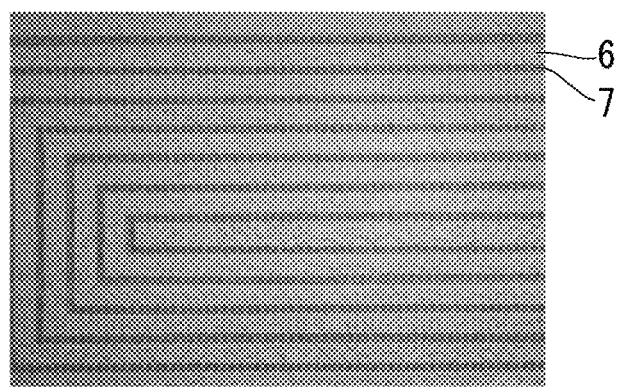
FIG. 4 is a diagram illustrating a state of a back surface of a Si substrate after the formation of Al alloy layers according to Embodiment 1 of the present invention.

Embodiment of the present invention will be described below with reference to the drawings.

<Related Technique>

FIG. 12 illustrates a related technique relating to Embodiments of the present invention. FIG. 12 is a cross-sectional view illustrating a configuration of a semiconductor device 18 according to a related technique. Note that, in FIG. 12, a diode configuration is illustrated as a semiconductor device 18. Further, in FIG. 12, the surface of each layer on the upper side in the drawing sheet is called "front surface", and the surface of each layer on the lower side in the drawing sheet is called "back surface". The expressions "front side" and "back side" are similarly applied to FIGS. 1, 9, 10, and 11 described later.

A p-type anode layer 4 is provided on the front surface of a Si substrate 2. An anode electrode 5 that is in ohmic contact with the p-type anode layer 4 is provided on the p-type anode layer 4. The Si substrate 2 includes an n-type drift layer 3.

On the back surface of the Si substrate 2, an n-type cathode layer 6 and a p-type cathode layer 7 are provided adjacent to each other in plan view.

An Al alloy layer 19 that is in ohmic contact with the n-type cathode layer 6 and the p-type cathode layer 7 is provided on the n-type cathode layer 6 and the p-type cathode layer 7. The Al alloy layer 19 is made of an Al alloy containing Si and has a crystal orientation of (111) plane in plan view. The Al alloy layer 19 constitutes a back electrode (cathode electrode).

FIG. 13 is a diagram illustrating a state of the back surface of the Si substrate 2 after the Al alloy layer 19 is formed. Specifically, FIG. 13 is a photograph taken after the Al alloy layer 19 is formed on the back surface of the Si substrate 2 by sputtering and a heat treatment is performed.

Figure 14:
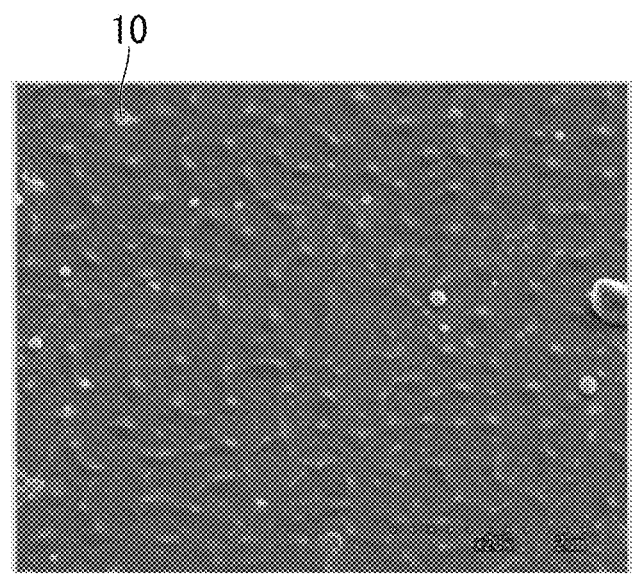
FIG. 14 is a diagram illustrating a state of a surface of a p-type cathode layer after the formation of the Al alloy layer according to the related technique.
Figure 15:
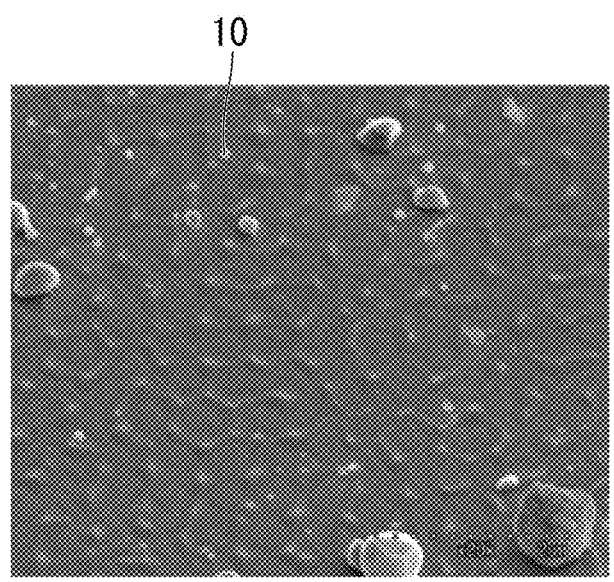
FIG. 15 is a diagram illustrating a state of a surface of an n-type cathode layer after the formation of the Al alloy layer according to the related technique.

FIG. 14 is a diagram illustrating a state of a surface of the p-type cathode layer 7 after the Al alloy layer 19 is formed. Also, FIG. 15 is a diagram illustrating a state of a surface of the n-type cathode layer 6 after the Al alloy layer 19 is formed. Specifically, FIGS. 14 and 15 are photographs taken after the Al alloy layer 19 illustrated in FIG. 13 is peeled off. As illustrated in FIGS. 14 and 15, when the Al alloy layer 19 is formed and the heat treatment is performed, the Si nodules 10 are formed on each of a surface of the p-type cathode layer 7 and a surface of the n-type cathode layer 6. Note that, in FIGS. 14 and 15, each of the plurality of convex portions is a Si nodule 10.

As described above, the formation of the Si nodules 10 on the n-type cathode layer 6 has been a problem of an increase in on-voltage. Embodiments of the present invention have been made to solve such a problem, and will be described in detail below.

Embodiment 1

<Configuration>

Figure 1:
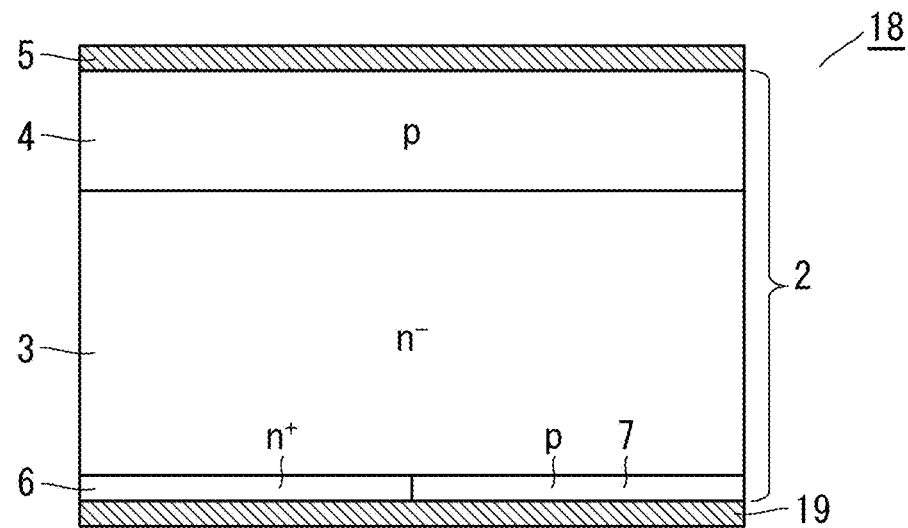
FIG. 1 is a cross-sectional view illustrating a configuration of a semiconductor device according to Embodiment 1 of the present invention.
Figure 1:
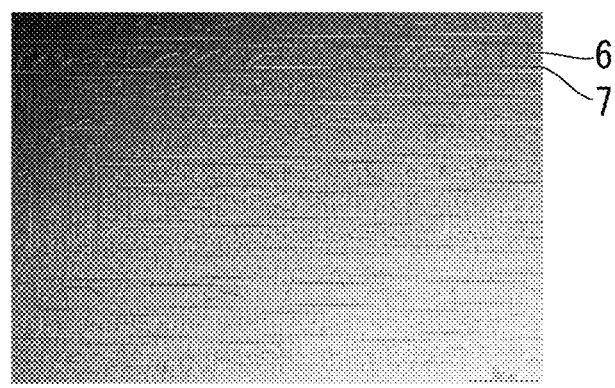

FIG. 1 is a cross-sectional view illustrating a configuration of a semiconductor device 1 according to Embodiment 1. Note that, in FIG. 1, a diode configuration is illustrated as a semiconductor device 1.

A p-type anode layer 4 is provided on the front surface of a Si substrate 2. An anode electrode 5 that is in ohmic contact with the p-type anode layer 4 is provided on the p-type anode layer 4. The Si substrate 2 corresponds to an n-type semiconductor substrate and includes an n-type drift layer 3.

On the back surface of the Si substrate 2, an n-type cathode layer 6 and a p-type cathode layer 7 are provided adjacent to each other in plan view. The impurity concentration in the n-type cathode layer 6 is 1E19 cm$^{-3}$ or higher. The impurity concentration in the p-type cathode layer 7 is 10% or lower of the impurity concentration in the n-type cathode layer 6. For example, the impurity concentration in the p-type cathode layer 7 may be 1E16 to 5E18 cm$^{-3}$.

An Al alloy layer 8 that is in ohmic contact with the n-type cathode layer 6 is provided on the n-type cathode layer 6.

The Al alloy layer 8 is made of an Al alloy containing Si and has a crystal orientation of (111) plane in plan view.

An Al alloy layer 9 that is in ohmic contact with the p-type cathode layer 7 is provided on the p-type cathode layer 7. The Al alloy layer 9 is made of an Al alloy containing Si and has a crystal orientation of (110) plane in plan view.

The Al alloy layer 8 corresponds to a first Al alloy layer, and the Al alloy layer 9 corresponds to a second Al alloy layer. The Al alloy layer 8 and the Al alloy layer 9 constitute a back electrode (cathode electrode).

<Manufacturing Method>

A manufacturing method of the semiconductor device 1 will be described.

For example, impurities are implanted into the front surface of the Si substrate 2 to form the p-type anode layer 4. Next, the anode electrode 5 is formed on the p-type anode layer 4. Subsequently, impurities are implanted into the back surface of the Si substrate 2 to form the n-type cathode layer 6 and the p-type cathode layer 7 so as to be adjacent to each other on the back surface of the Si substrate 2. At this point, the impurity concentration in the n-type cathode layer 6 is 1E19 cm$^{-3}$ or higher and the impurity concentration in the p-type cathode layer 7 is 10% or lower of the impurity concentration in the n-type cathode layer 6.

Next, the Al alloy layer 8 is formed on the n-type cathode layer 6, and the Al alloy layer 9 is formed on the p-type cathode layer 7. Specifically, the Al alloy is sputtered on each of the n-type cathode layer 6 and the p-type cathode layer 7 by applying a voltage to an Al alloy target containing Si to cause discharge. After sputtering, the Al alloy layer 8 and the Al alloy layer 9 are heated.

The sputtering process is roughly divided into an initial sputtering process and a final sputtering process. In the initial sputtering process, a spark discharge based on Paschen's law is generated by applying a voltage of 800 V to 1300 V to the Al alloy which is the target. At this point, by disposing a shield so as to cover the back surface of the Si substrate 2, the Al alloy layer 8 and the Al alloy layer 9 are prevented from being formed on the back surface of the Si substrate 2. In the final sputtering process, a glow discharge is generated by applying a voltage of 300 V to 700 V, which is lower than the voltage applied to the target in the initial sputtering process. After the glow discharge is generated, the shield disposed so as to cover the back surface of the Si substrate 2 is removed, and the Al alloy layer 8 and the Al alloy layer 9 are formed on the back surface of the Si substrate 2. When sputtering, the chamber is filled with argon (Ar) gas, for example.

The semiconductor material used in the semiconductor device 1 is not limited to Si, and a wide band gap material such as SiC or GaN may be used.

<Orientations of Al Alloy Layer 8 and Al Alloy Layer 9>

The orientations of the Al alloy layer 8 and the Al alloy layer 9 will be described. FIGS. 2 and 3 are diagrams for illustrating crystal orientations of Si and Al. Each crystal orientation in FIGS. 2 and 3 indicates a crystal orientation in plan view.

Generally, the Al alloy layer formed by sputtering is oriented in the (111) plane. This is because Al has a face-centered-cubic structure in which the (111) plane is the most closely packed. However, if the voltage applied to the target in the initial sputtering process is lowered, or if the Al alloy layer is not formed on the Si substrate in the initial sputtering process, the attack on the front surface of the Si substrate is mitigated, and an Al alloy layer reflecting the crystal orientation of the front surface of the underlying Si substrate is formed. For example, when the crystal orientation of Si on the front surface of the Si substrate is the (100) plane, the Al alloy layer is oriented in the (110) plane. Further, when the crystal orientation of Si on the front surface of the Si substrate is the (111) plane, the Al alloy layer is oriented in the (111) plane. This is because, as illustrated in FIGS. 2 and 3, the interatomic distance of four Si atoms and the interatomic distance of five Al atoms are equal in both cases.

<Mechanism of Segregation of Si Nodules>

As described above, the n-type cathode layer 6 has the crystal orientation of Si in the (111) plane due to the implantation of high-concentration impurities. Further, the p-type cathode layer 7 has a smaller amount of implanted impurities; therefore, the crystal orientation of Si is the (100) plane, which is the same as that of the base material. Then, an Al alloy is sputtered on the n-type cathode layer 6 and the p-type cathode layer 7 and the heat treatment is performed. At this point, the Al alloy layer 8 formed on the n-type cathode layer 6 is oriented in the (111) plane under the influence of the (111) plane which is the crystal orientation of the underlying Si. Also, the Al alloy layer 9 formed on the p-type cathode layer 7 is oriented in the (110) plane under the influence of the (100) plane which is the crystal orientation of the underlying Si.

During the heat treatment after sputtering, the Al alloy layer 9 of the (110) plane formed on the p-type cathode layer 7 is less closely packed than the Al alloy layer 8 of the (111) plane formed on the n-type cathode layer 6. Therefore, more Si nodules having p-type characteristics are generated at the interface between the less-packed Al alloy layer 9 and the p-type cathode layer 7, and not many Si nodules are generated at the interface between the Al alloy layer 8 and the n-type cathode layer 6. As described above, the on-voltage of the semiconductor device 1 can be reduced by reducing the Si nodules generated on the n-type cathode layer 6.

FIG. 4 is a diagram illustrating a state of the back surface of the Si substrate 2 after the Al alloy layer 8 and the Al alloy layer 9 are formed. Specifically, FIG. 4 is a photograph taken after the Al alloy layer 8 and the Al alloy layer 9 are formed on the back surface of the Si substrate 2 by sputtering and the heat treatment is performed.

Figure 5:
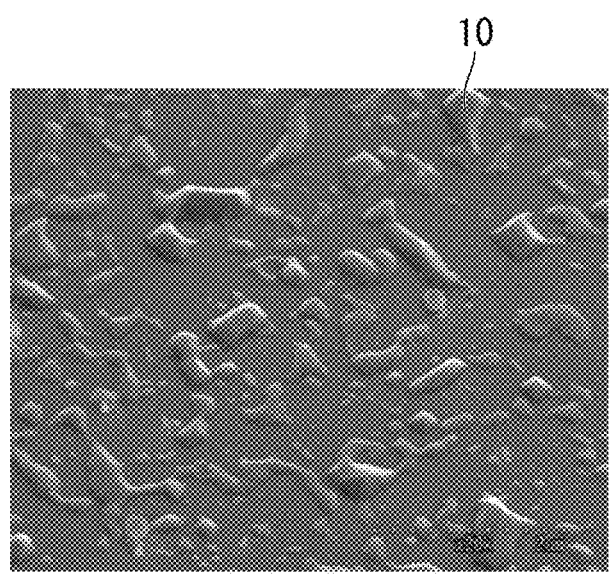
FIG. 5 is a diagram illustrating a state of a surface of a p-type cathode layer after the formation of the Al alloy layer according to Embodiment 1 of the present invention.

FIG. 5 is a diagram illustrating a state of a surface of the p-type cathode layer 7 after the Al alloy layer 9 is formed. Also, FIG. 6 is a diagram illustrating a state of a surface of the n-type cathode layer 6 after the Al alloy layer 8 is formed. Specifically, FIGS. 5 and 6 are photographs taken after the Al alloy layer 8 and the Al alloy layer 9 illustrated in FIG. 4 are peeled off. As illustrated in FIG. 5, when the Al alloy layer 9 is formed and the heat treatment is performed, the Si nodules 10 are formed on the p-type cathode layer 7. Meanwhile, as illustrated in FIG. 6, when the Al alloy layer 8 is formed and the heat treatment is performed, not many Si nodules 10 are formed on the n-type cathode layer 6. Compared with the related technique illustrated in FIG. 15, it can be seen that the number of Si nodules 10 generated on the n-type cathode layer 6 are reduced in Embodiment 1 illustrated in FIG. 6. Note that, in FIGS. 5 and 6, each of the plurality of convex portions is a Si nodule 10.

<Modification 1>

Although the case where the Al alloy layer 8 has the (111) plane and the Al alloy layer 9 has the (110) plane has been described above, the present invention is not limited thereto.

For example, less than 40% of the area of the Al alloy layer 8 in plan view may have a crystal orientation of other than the (111) plane. Also, less than 40% of the area of the Al alloy layer 9 in plan view may have a crystal orientation of other than the (110) plane.

<Modification 2>

Although the example of FIG. 1 illustrates a case where the boundary between the n-type cathode layer 6 and the p-type cathode layer 7 coincides with the boundary between the Al alloy layer 8 and the Al alloy layer 9, the configuration is not limited thereto.

For example, as illustrated in FIG. 7, the boundary between the Al alloy layer 8 and the Al alloy layer 9 may be present on the p-type cathode layer 7. In this case, the Al alloy layer 8 needs only be provided on the p-type cathode layer 7 so as to occupy less than 15% of the area of the p-type cathode layer 7 in plan view.

Figure 8:
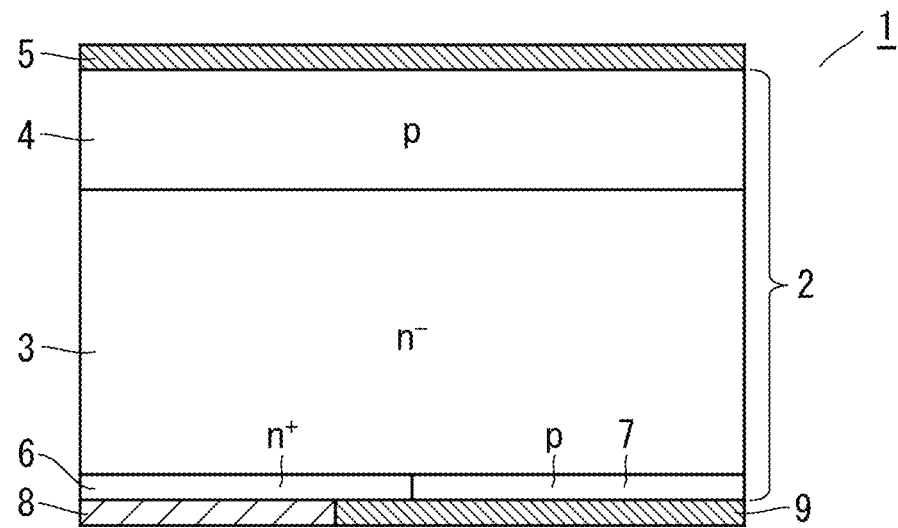
FIG. 8 is a cross-sectional view illustrating a configuration of the semiconductor device according to Embodiment 1 of the present invention.

Also, for example, as illustrated in FIG. 8, the boundary between the Al alloy layer 8 and the Al alloy layer 9 may be present on the n-type cathode layer 6. In this case, the Al alloy layer 9 needs only be provided on the n-type cathode layer 6 so as to occupy less than 15% of the area of the n-type cathode layer 6 in plan view.

<Effects>

From the above, according to Embodiment 1, by forming the Al alloy layer 8 and the Al alloy layer 9 on each of the n-type cathode layer 6 and the p-type cathode layer 7 with the impurity concentration in the n-type cathode layer 6 being $1E19\ cm^{-3}$ or higher, and the impurity concentration in the p-type cathode layer 7 being 10% or lower of the concentration in the n-type cathode layer 6, a large number of Si nodules 10 are generated at the interface between the Al alloy layer 9 and the p-type cathode layer 7, and the number of Si nodules 10 generated at the interface between the Al alloy layer 8 and the n-type cathode layer 6 can be reduced. As described above, the on-voltage of the semiconductor device 1 can be reduced by reducing the Si nodules 10 generated on the n-type cathode layer 6.

Embodiment 2

Figure 9:
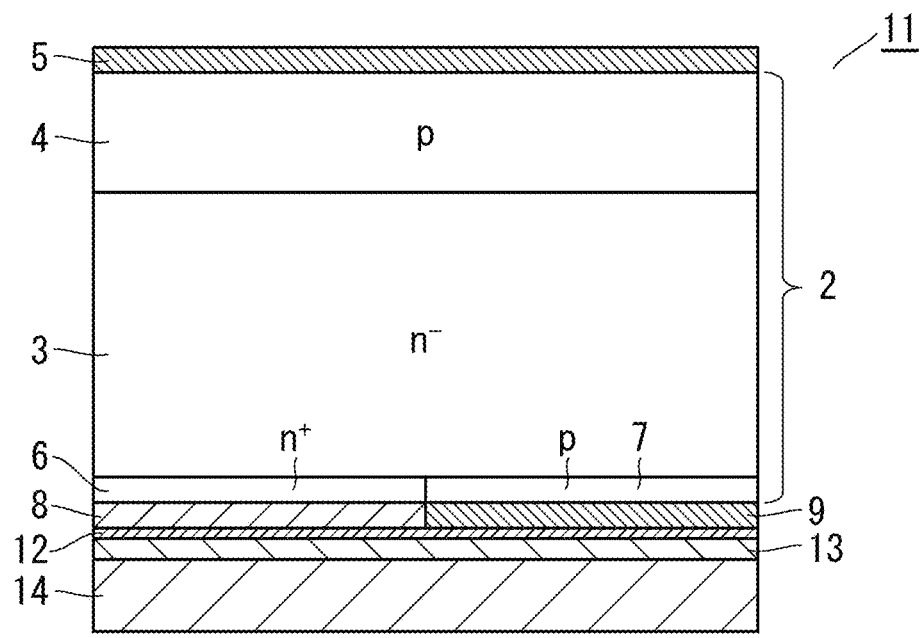
FIG. 9 is a cross-sectional view illustrating a configuration of a semiconductor device according to Embodiment 2 of the present invention.

FIG. 9 is a cross-sectional view illustrating a configuration of a semiconductor device 11 according to Embodiment 2. Note that, in FIG. 9, a diode configuration is illustrated as a semiconductor device 11.

As illustrated in FIG. 9, the semiconductor device 11 is characterized in that a barrier metal layer 12, an Al alloy layer 13, and a nickel (Ni) layer 14 are included therein. Other configurations and the manufacturing method are the same as Embodiment 1, and description thereof is omitted here.

The barrier metal layer 12 is provided on the Al alloy layer 8 and the Al alloy layer 9. The barrier metal layer 12 is composed of, for example, titanium (Ti).

The Al alloy layer 13 is provided on the barrier metal layer 12. The Al alloy layer 13 is composed of an Al alloy containing Si. Note that, the Al alloy layer 13 corresponds to a third Al alloy layer.

The Ni layer 14 is provided on the Al alloy layer 13. The thickness of the Ni layer 14 is, for example, 2 μm or more. By setting the thickness of the Ni layer 14 to 2 μm or more, the stress on the semiconductor device 11 housed in the package can be relaxed.

The Al alloy layer 8, the Al alloy layer 9, the barrier metal layer 12, the Al alloy layer 13, and the Ni layer 14 constitute a back electrode (cathode electrode).

In order to relax the stress on the semiconductor device housed in the package, a semiconductor device having electrodes thickened by using a plating technique is generally adopted. When the plating technique is adopted when forming the Al alloy layer 8 and the Al alloy layer 9 of the semiconductor device 1 illustrated in FIG. 1, the less-packed Al alloy layer 9 is weak in resistance to the etching treatment in the plating treatment. Therefore, the Al alloy layer 9 after the etching treatment becomes more uneven than the Al alloy layer 8, and the thicknesses of the Al alloy layer 8 and the Al alloy layer 9 are non-uniform in thickness when viewed as a whole. On the other hand, as illustrated in FIG. 9, by providing the barrier metal layer 12 on the Al alloy layer 8 and the Al alloy layer 9, the Al alloy layer 13 provided on the barrier metal layer 12 is oriented in the (111) plane and becomes close-packed. As described above, by providing the close-packed Al alloy layer 13, the resistance to the etching treatment is improved, and the Al alloy layer 13 having a uniform thickness can be obtained.

From the above, according to Embodiment 2, the same effect as that of Embodiment 1 can be obtained. Further, by providing the barrier metal layer 12 on the Al alloy layer 8 and the Al alloy layer 9, and by providing the Al alloy layer 13 on the barrier metal layer 12, the resistance to the etching treatment is improved even if the plating technique is adopted, and the Al alloy layer 13 having a uniform thickness can be obtained.

Embodiment 3

Figure 10:
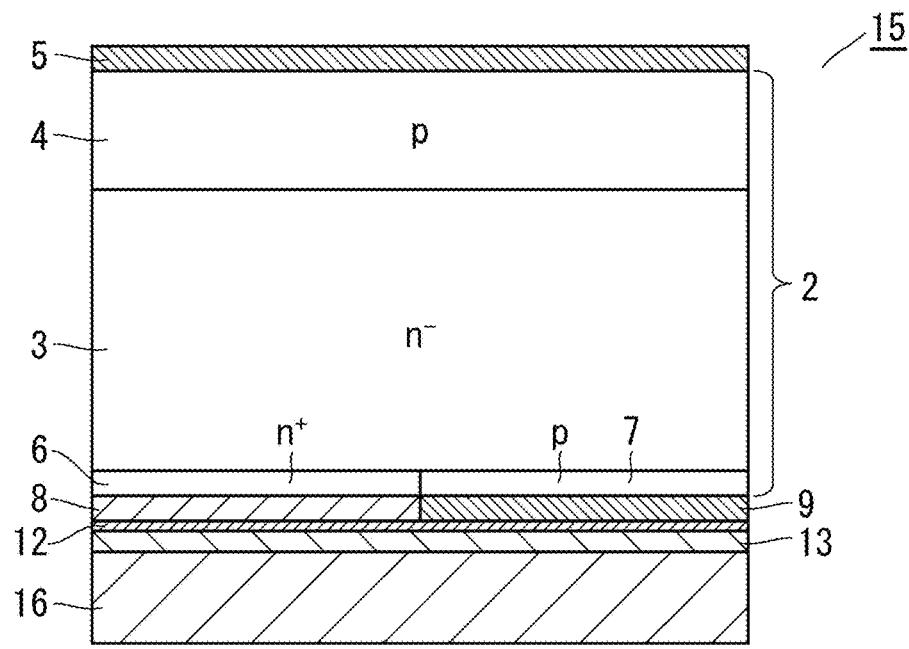
FIG. 10 is a cross-sectional view illustrating a configuration of a semiconductor device according to Embodiment 3 of the present invention.

FIG. 10 is a cross-sectional view illustrating a configuration of a semiconductor device 15 according to Embodiment 3. Note that, in FIG. 10, a diode configuration is illustrated as a semiconductor device 15.

As illustrated in FIG. 10, the semiconductor device 15 is characterized in that a copper (Cu) layer 16 is included therein. Other configurations and the manufacturing method are the same as Embodiment 2, and description thereof is omitted here.

The Cu layer 16 is provided on the Al alloy layer 13. The thickness of the Cu layer 16 is, for example, 10 μm or more. When a Cu layer is used for the back electrode, Cu is used for the die-bonding wire in many cases. The Cu wire is hard; therefore, if the thickness of the Cu layer is not 10 μm or more, the Si substrate may be unable to withstand the energy at the time of die bonding and crack. In order to prevent this, the thickness of the Cu layer 16 is preferably 10 μm or more.

Note that, the Al alloy layer 8, the Al alloy layer 9, the barrier metal layer 12, the Al alloy layer 13, and the Cu layer 16 constitute a back electrode (cathode electrode).

From the above, according to Embodiment 3, the same effect as that of Embodiment 2 can be obtained. Further, by providing the Cu layer 16 having high thermal conductivity, the heat radiation of the semiconductor device 15 is improved. Therefore, the high temperature operation of the semiconductor device 15 is ensured, and the breakdown resistance is improved.

Embodiment 4

Figure 11:
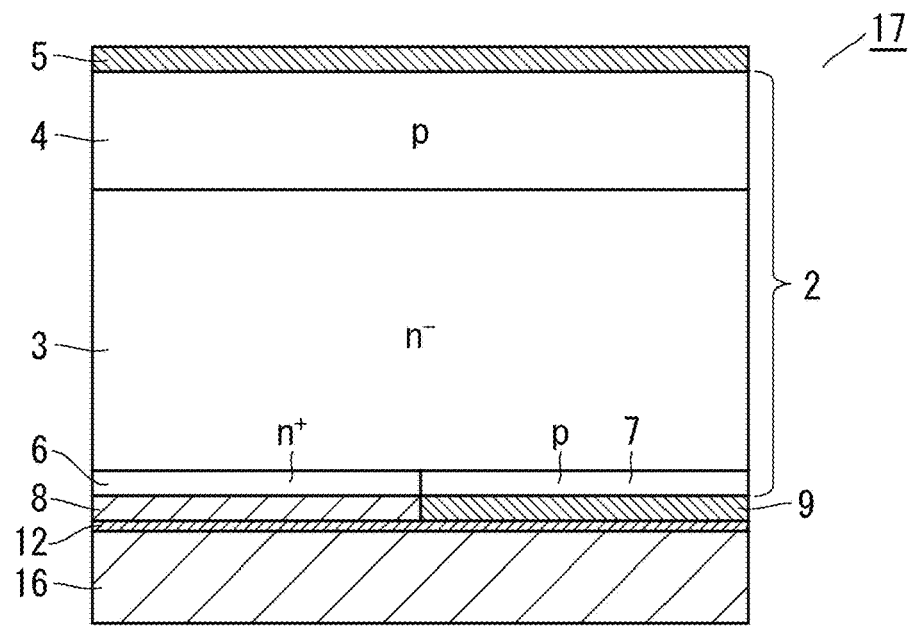
FIG. 11 is a cross-sectional view illustrating a configuration of a semiconductor device according to Embodiment 4 of the present invention.

FIG. 11 is a cross-sectional view illustrating a configuration of a semiconductor device 17 according to Embodiment 4. Note that, in FIG. 11, a diode configuration is illustrated as a semiconductor device 17.

As illustrated in FIG. 11, the semiconductor device 17 is characterized in that a Cu layer 16 is provided on a barrier metal layer 12. That is, the semiconductor device 17 has a configuration in which the Al alloy layer 13 is removed from the semiconductor device 15 illustrated in FIG. 10 described in Embodiment 3. Other configurations and the manufacturing method are the same as Embodiment 3, and description thereof is omitted here.

The Cu layer 16 is provided on the barrier metal layer 12. The thickness of the Cu layer 16 is, for example, 10 μm or more. Note that, the Al alloy layer 8, the Al alloy layer 9, the barrier metal layer 12, and the Cu layer 16 constitute a back electrode (cathode electrode).

From the above, according to Embodiment 4, the same effect as that of Embodiment 1 can be obtained. Further, by providing the Cu layer 16 having high thermal conductivity, the heat radiation of the semiconductor device 17 is improved. Therefore, the high temperature operation of the semiconductor device 17 is ensured, and the breakdown resistance is improved.

It should be noted that Embodiments of the present invention can be arbitrarily combined and can be appropriately modified or omitted without departing from the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
an n-type semiconductor substrate;
a p-type anode layer provided on a front surface of the n-type semiconductor substrate;
an anode electrode provided on the p-type anode layer;
an n-type cathode layer and a p-type cathode layer provided adjacent to each other on a back surface of the n-type semiconductor substrate;
a first Al alloy layer provided on the n-type cathode layer and containing Si; and
a second Al alloy layer provided on the p-type cathode layer and containing Si, wherein
impurity concentration in the n-type cathode layer is 1E19 $cm^{-3}$ or higher and impurity concentration in the p-type cathode layer is 10% or lower of the impurity concentration in the n-type cathode layer.

2. The semiconductor device according to claim 1, wherein,
in plan view, the first Al alloy layer has a crystal orientation of (111) plane and the second Al alloy layer has a crystal orientation of (110) plane.

3. The semiconductor device according to claim 1, further comprising:
a barrier metal layer provided on the first Al alloy layer and the second Al alloy layer;
a third Al alloy layer provided on the barrier metal layer and containing Si; and
a Ni layer provided on the third Al alloy layer.

4. The semiconductor device according to claim 3, wherein
the Ni layer has a thickness of 2 μm or more.

5. The semiconductor device according to claim 2, further comprising:
a barrier metal layer provided on the first Al alloy layer and the second Al alloy layer;
a third Al alloy layer provided on the barrier metal layer and containing Si; and
a Ni layer provided on the third Al alloy layer.

6. The semiconductor device according to claim 5, wherein
the Ni layer has a thickness of 2 μm or more.

7. The semiconductor device according to claim 1, further comprising:
- a barrier metal layer provided on the first Al alloy layer and the second Al alloy layer;
- a third Al alloy layer provided on the barrier metal layer and containing Si; and
- a Cu layer provided on the third Al alloy layer.

8. The semiconductor device according to claim 7, wherein
the Cu layer has a thickness of 10 μm or more.

9. The semiconductor device according to claim 2, further comprising:
- a barrier metal layer provided on the first Al alloy layer and the second Al alloy layer;
- a third Al alloy layer provided on the barrier metal layer and containing Si; and
- a Cu layer provided on the third Al alloy layer.

10. The semiconductor device according to claim 9, wherein
the Cu layer has a thickness of 10 μm or more.

11. The semiconductor device according to claim 1, further comprising:
- a barrier metal layer provided on the first Al alloy layer and the second Al alloy layer; and
- a Cu layer provided on the barrier metal layer.

12. The semiconductor device according to claim 11, wherein
the Cu layer has a thickness of 10 μm or more.

13. The semiconductor device according to claim 2, further comprising:
- a barrier metal layer provided on the first Al alloy layer and the second Al alloy layer; and
- a Cu layer provided on the barrier metal layer.

14. The semiconductor device according to claim 13, wherein
the Cu layer has a thickness of 10 μm or more.

* * * * *